United States Patent

Chu et al.

[11] Patent Number: 6,162,743
[45] Date of Patent: Dec. 19, 2000

[54] LOW DIELECTRIC CONSTANT FILM AND METHOD THEREOF

[76] Inventors: Cheng-Jye Chu, 10925 Missouri Ave., Los Angeles, Calif. 90025; Qin Jang, 24608 Vista Ceriots, Calabasas, Calif. 91302; Wei Qiang, 6972 Melba Ave., West Hills, Calif. 91307; Yuhua Du, 7841 Reseda, Apt. 310, Reseda, Calif. 91335

[21] Appl. No.: 09/021,716

[22] Filed: Feb. 10, 1998

[51] Int. Cl.$^7$ .................................................. H01L 21/31
[52] U.S. Cl. ........................ 438/781; 524/806; 524/492; 524/493
[58] Field of Search ............................ 438/780; 524/806, 524/492, 493

[56] References Cited

U.S. PATENT DOCUMENTS

| | | | |
|---|---|---|---|
| 4,052,430 | 10/1977 | Yajima et al. | 260/448.2 |
| 4,220,600 | 9/1980 | Yajima et al. | 556/434 |
| 5,492,945 | 2/1996 | Morita et al. | 523/212 |
| 5,602,060 | 2/1997 | Kobayashi et al. | 437/238 |
| 5,693,566 | 12/1997 | Cheung | 437/195 |
| 5,789,325 | 8/1998 | Chandra et al. | 438/781 |
| 5,866,932 | 2/1999 | Yamazaki et al. | 257/347 |
| 5,949,130 | 9/1999 | Fukuyama et al. | 257/632 |
| 5,989,945 | 11/1999 | Yudasaka et al. | 438/149 |

FOREIGN PATENT DOCUMENTS

| | | | |
|---|---|---|---|
| 07118007 | 5/1995 | Japan | C01B 3/12 |

OTHER PUBLICATIONS

Cheng–Jye Chu et al., Direct Patterning Low–K Material for Damascene Process, Feb. 10–11, 1997 DUMIC Conference, pp. 93–97.

Shyun–ichi Fukuyama et al., Two–Step Planarization Technique Using Polycarbosilane, Feb. 21–22, 1995, DUMIC Conference, pp. 80–86.

*Primary Examiner*—Matthew Smith
*Assistant Examiner*—Renzo N. Rocchegiani

[57] ABSTRACT

A dielectric film comprising silicon, oxygen and carbon having a low dielectric constant, superior thermal stability and adhesion to commonly employed semiconductor materials is described. The film is formed from a polyorganosilane polymer applied to a substrate and subsequently cured in a two-step or three-step cure process. The film is advantageously suited for, among other things, damascene, double damascene and interlayer dielectric applications.

18 Claims, No Drawings

LOW DIELECTRIC CONSTANT FILM AND METHOD THEREOF

BACKGROUND

1. Scope of the Invention

The present invention relates generally to films comprising silicon, oxygen and carbon formed from polyorganosilanes and methods of manufacture thereof, and more specifically to films comprising silicon, oxygen and carbon having a dielectric constant lower than 3.3 formed from polyorganosilanes films applied to substrates, and methods of manufacture thereof.

2. Related Art

As the semiconductor industry introduces new generations of integrated circuits (IC's) having higher performance and greater functionality, the density of the elements that form those IC's is increased. To bring about this density increase, the size and spacing between the individual devices or elements is reduced. While in the past such reductions were limited only by the ability to define the structures photolithographically, device geometries having dimensions as small as 0.25 micron ($\mu$m) or smaller have created a new limiting factor, the dielectric constant of the insulating material(s) used between the elements. For example, for any two adjacent conductive paths, as the distance between the conductors decreases, the resulting capacitance, a function of the dielectric constant (K) of the insulating material divided by the distance between conductive paths, increases. This increased capacitance results in increased capacitive coupling between the conductors, increased power consumption and an increase in the RC time constant. Therefore, the continual improvement in semiconductor IC performance and functionality is dependent upon developing materials that form a dielectric film with a lower dielectric constant (K) than that of the most commonly used material, silicon oxide, thus resulting in reduced capacitance.

One approach for providing reduced K insulating films is doping the silicon oxide material. For example, doping silicon oxide with fluorine typically reduces K from about 3.9 to as low as 3.5. Processes for forming these doped films often advantageously use the same or similar methods that are used for forming undoped silicon oxide films. Hence the integration of fluorine doped films into the typical process flow is generally easily accomplished. However, as such fluorine doped films offer only a small decrease in K, other solutions having lower dielectric constants are needed. Also, as the doped films are formed in essentially the same manner as undoped films, planarization of films to meet photolithographic requirements is often required. Finally, the stability of such fluorine containing films with regard to moisture is problematic.

A number of families of organic polymers are another solution for providing low K dielectric films. Typically, organic polymers can form dielectric films where a K in the range of approximately 2.2–3.3 is possible. Generally, such dielectric films are formed by first applying a solution of an appropriate pre-polymer to a substrate. The substrate is then heated until the pre-polymer polymerizes to the degree desired and a solid film formed. As the organic material is applied as a liquid, some degree of surface planarization is effected and often no additional planarization is needed. However, while such organic polymer films provide both a lower dielectric constant and enhanced planarization as compared to silicon oxide films, formed for example by chemical vapor deposition, for other film properties such silicon oxide films have advantages. For example, organic materials generally have limited thermal stability above 450 degrees Centigrade (° C.); they often exhibit less adhesion to common metals, such as tungsten (W) and aluminum (Al); and the mechanical strength of such organic films is much less than that of silicon oxide.

In an approach for providing a silicon oxide layer having a planar surface, spin-on glass (SOG) compositions have been prepared utilizing polyorganosilsesquioxanes; for example, see U.S. Pat. No. 4,670,299 issued to Fukuyama et al. (Fukuyama '299). The SOG compositions of Fukuyama '299 are silylated organopolysilsesquioxanes. The compositions are applied in a manner similar to that described previously for the organic polymers and then heated to form a solid polymerized film. Recently, polycarbosilanes (PCS) are used to form SOG compositions, for example, see U.S. Pat. No. 5,602,060 issued to Kobayashi et al. (Kobayashi '060). Kobayashi '060 reported that such PCS derived SOG films provide improved planarization when compared to films prepared from traditional SOG compositions, for example as per Fukuyama '299. Kobayashi '060 states that the SOG of Fukuyama '299 does not typically have a low enough viscosity to provide films with excellent planarity when applied to a substrate having topography from normal semiconductor processing. While films derived from the PCS of Kobayashi '060 might provide improved planarization when compared to those of Fukuyama '299, the final film is essentially encompasses only silicon oxide and hence cannot provide a reduced dielectric constant.

Therefore it would be advantageous to have a final dielectric film that combines the advantages of a film formed from organic materials, e.g. a low dielectric constant, with those of a film formed from inorganic materials, e.g. thermal stability. It would also be advantageous to be able to form this dielectric film from a material that is applied to a substrate in a manner essentially similar to that of an organic polymer. In addition, it would be advantageous if the final dielectric film so formed, had superior adhesion to metals such as tungsten (W) and aluminum (Al) and is thermally stable to temperatures in excess of 450 degrees Centigrade.

SUMMARY

In accordance with this invention, polyorganosilanes (POS), and methods thereof, are provided having between 2 to 10,000 repeating units of the general structure:

Formula 1

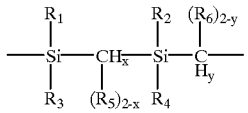

wherein $R_1$, $R_2$, $R_3$, $R_4$ are each independently selected from a group consisting of hydrogen, halide, alkyl, alkenyl, cycloalkyl or aryl; and wherein x and y are each independently 1 or 2 and $R_5$ and $R_6$ are each an organosilane group. In some embodiments of the present invention, one or more of the substituents $R_1$, $R_2$, $R_3$, $R_4$ are additionally, photosensitive ligands. Polyorganosilanes in accordance with the present invention are soluble in a variety of organic solvents.

Additionally, in some embodiments, a solution of one or more polyorganosilanes of the present invention are dispensed onto the surface of a substrate to form a POS polymer film. In some embodiments of the present invention, some or all of the polymer film formed is cured using, for example, a plasma, an electron beam, ulta-violet (UV) light and/or any other appropriate energy or heat source For example, in some embodiments a heat source is provided to cure a POS polymer film coated substrate at a reduced pressure with any residual atmosphere being inert or reducing in character. After the POS polymer film is cured at a reduced pressure and at a temperature of up to approximately 350° C., a final film comprising silicon, oxygen and carbon (SOC), insoluble in organic solvents and having a dielectric constant (K) of less than 3.3 is formed.

In some embodiments, the POS polymer film is cured using a two step cure process. A first two step cure process encompasses the above described vacuum cure step and a second step wherein the film is heated in an inert atmosphere, at atmospheric pressure, to a temperature of up to approximately 450° C. After curing using the first two step cure, embodiments of the present invention have excellent planarity and a dielectric constant of less than 3.3. In other embodiments, a second two step cure process is used. The second two step process encompasses the above described vacuum cure step and a second step wherein the film is heated in an oxidizing atmosphere, at atmospheric pressure, to a temperature of up to approximately 450° C. After curing using the second two step cure process, embodiments of the present invention have excellent planarity and a dielectric constant of less than 3.3. Regardless of whether the first or second two step cure process is employed, the POS poly film of the present invention forms a SOC film.

In still other embodiments of the present invention a three step cure process is employed. The three step process encompasses the first two step process as just described and a third step wherein the film is heated in an oxidizing atmosphere, at atmospheric pressure, to a temperature of up to approximately 450° C. After curing using the three step process, embodiments of the present invention encompass an SOC film and have excellent thermal stability, mechanical strength and a dielectric constant of less than 3.3.

In some embodiments of the present invention, the POS polymer film is formed and cured to an SOC film having a thickness of between approximately 0.3 to 0.7 microns ($\mu$m) and employed in a damascene process. In some embodiments of the present invention, the SOC film is formed having a thickness of between approximately 0.7 to 1.25 $\mu$m and employed in a double damascene process. While in other embodiments the SOC film is formed having a thickness of between approximately 1.3 to 1.5 $\mu$m on a patterned wafer and employed as an interlayer dielectric or passivation layer. In some embodiments, one or more SOC film layers are formed to provide a microelectronic device having a multi-layer interconnect structure.

DETAILED DESCRIPTION

As embodiments of the present invention are described, various modifications or adaptations of the specific materials, methods and/or structures may become apparent to those skilled in the art. All such modifications, adaptations or variations that rely upon the teachings of the present invention, and through which these teachings have advanced the art, are considered to be within the spirit and scope of the present invention. For example, in some embodiments of the present invention a single polyorganosilane polymer film is formed on a substrate and heated to form a film comprising silicon, oxygen and carbon (SOC) having a first thickness. In other embodiments, multiple layers of polyorganosilane polymer films are formed on a substrate and this multi-layer polymer film is heated to form a SOC film having a second thickness greater than the first thickness.

The present invention relates to a polyorganosilane (POS) polymer and a method for the formation of a final dielectric film comprising silicon, oxygen and carbon (SOC) on a substrate. The final dielectric or SOC film so formed is essentially free of cracks and pinholes and is essentially insoluble in organic solvents.

The POS polymer of the present invention encompasses between 2 to 10,000 repeating units of the general structure:

Formula 1

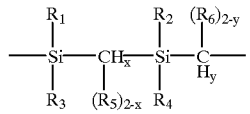

wherein $R_1$, $R_2$, $R_3$, $R_4$ are each independently selected from a group consisting of hydrogen, halide, alkyl, alkenyl, cycloalkyl or aryl; and wherein x and y are each independently 1 or 2 and $R_5$ and $R_6$ are each an organosilane group. In some embodiments of the present invention, one or more of the substituents $R_1$, $R_2$, $R_3$, $R_4$ are additionally, photosensitive ligands. Polyorganosilanes in accordance with the present invention are soluble in a variety of organic solvents.

It will be understood that reference herein to halide refers to fluoride, chloride, bromide or mixtures thereof; reference herein to alkyl refers to alkyl groups having between 1 and 8 carbons; reference herein to alkenyl refers to alkenyl groups having between 2 and 8 carbons; reference herein to cycloalkyl refers to cycloalkyl groups having between 4 and 10 carbons; reference herein to aryl refers to phenyl and alkyl substituted phenyl groups; and reference herein to photo-sensitive ligands refers to alkenyl, alkynyl or organoazide groups, for example substituted and unsubstituted phenylazides and ethylnyl groups.

In some embodiments of the present invention, a POS polymer having between 5 and 50 repeating units of Formula 1 is preferred. In some embodiments, a POS polymer having between 10 and 30 repeating units of Formula 1 is preferred. Not withstanding the number of repeating units therein, in some embodiments in accordance with the present invention one or more of the groups $R_1$, $R_2$, $R_3$, and/or $R_4$ are photo-sensitive ligands.

Generally, the polyorganosilane polymers of the present invention are synthesized by first forming a basic organosilane structure in the manner of Yajima et al. (See, Handbook of Composites, Vol. 1, Chapter VI, (1985)). This starting POS having the general formula:

Formula 2

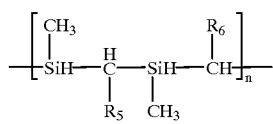

where $R_5$ and $R_6$ are as previously described and n is an integer between 2 and 50.

Halides, alkyl, cycloalkyl, and aryl groups are introduced to the polymer chain through a hydrosilylation reaction. For example, in general:

Reaction 1

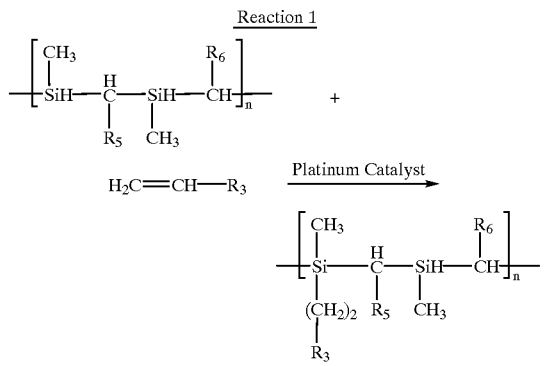

wherein $R_3$ is hydrogen, halide, alkyl, alkenyl, cycloalkyl or aryl, as previously described with respect to Formula 1; and the platinum catalyst is, for example, $H_2PtCl_6$, a platinum carbonyl or a platinum-divinyltetramethyldisiloxane complex.

Thus the reaction of styrene with the POS of Formula 2, where $R_5$ and $R_6$ are H, proceeds by the following reaction:

Reaction 2

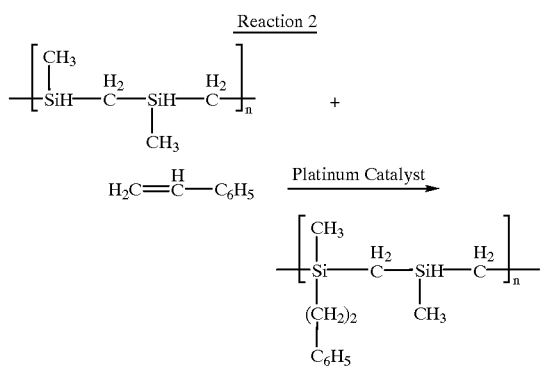

Hydrosilylation reactions are typically performed at room temperature in an organic solvent such as hexanes, xylenes or tetrahydrofuran.

Where an alkenyl group is desired, the substitution follows the path of the well known Grignard reaction. Halogenation is achieved by a transhalogenation reaction employing the appropriate trimethylhalosilane and a Lewis Acid. For example, chlorination would employ trichlorosilane and $AlCl_3$.

As one of ordinary skill in the art will realize, where the substituents $R_1$, $R_2$, $R_3$ and $R_4$ are preferred to be selected independently, a plurality of substitution reactions, as described above, are performed to place the selected substituents on the backbone of the polymer chain. It will be understood that the amount of any one substituent added is controlled by varying the ratio of equivalent weights of reagent used with respect to the number of backbone sites. For example, where $R_1$ and $R_2$ of Formula 1 are selected as an ethyl benzene group and a cyclohexyl ethyl group, respectively, two separate substitution reactions are performed. In a first reaction an equivalent weight of, for example, styrene is employed as illustrated in Reaction 2. Referring to Reaction 3 below, in a second reaction, an equivalent weight of acetylene is employed with the product of Reaction 2 and substitution at an as yet unsubstituted backbone site results.

Reaction 3

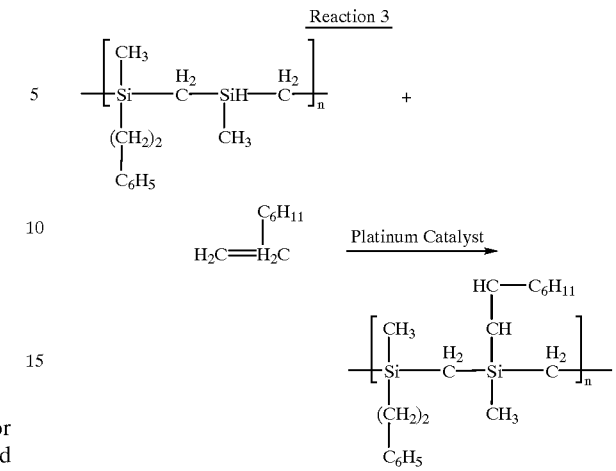

As one of ordinary skill in the art knows, formation of the product of Reaction 3, having the general formula of the POS shown as Formula 1, is the most likely result.

The progress of each of the aforementioned substitution reactions is readily monitored using Fourier Transform Infra-Red (FT IR) spectroscopy. Thus as the reaction proceeds, the intensity of the Si—H peak in the starting polymer is reduced as the hydrogen is replaced in the product. Hence by periodically withdrawing small samples from the reaction mixture, progress in forming the product is readily monitored.

As previously mentioned, the polyorganosilane (POS) polymer formed by embodiments of the present invention is used to form a POS film on a substrate. Generally, once the desired polyorganosilane polymer is formed and purified, an appropriate amount is dissolved in an organic solvent in preparation for application to a substrate. The organic solvent employed is typically an aprotic solvent encompassing aromatic solvents such as toluene or xylene, aliphatic solvents such as hexane, heptane or octane, ketone solvents such as methyl ethyl ketone or methyl isobutyl ketone and ester solvents such as butyl acetate or isoamyl acetate. It will additionally be understood that mixtures of one or more of these aprotic solvents can also be employed where desired.

In addition, it will be understood that the substrate, upon which the POS film is formed can encompass a variety of appropriate materials. Thus in some embodiments of the present invention, a glass substrate is employed, while in some embodiments a ceramic or metal substrate is used. In some embodiments, a semiconductor substrate, for example a silicon wafer having one or more semiconductor devices formed therein is the substrate employed. Finally, it will also be understood that the solution of POS material is applied to a surface of the substrate selected. In some embodiments of the present invention this surface presents topographical variations, which are planarized by the polyorganosilane polymer film and the method of formation of the present invention.

While generally, the POS solution is applied to the substrate using spin coating techniques and methods, other appropriate coating methods are also employed. Thus, in some embodiments of the present invention, spray coating, roller coating or immersion methods are used. Additionally, it will be understood that while solutions of the POS material prepared in accordance with the present invention are typically of low viscosity, for example 0.1 to 1000 centipoise (cp) the viscosity of any specific solution is typically tailored to a specific application and/or method of application. For example, for any given coating process, solutions with a viscosity of, for example 100 cP will result in a thicker film being formed than the same process employing a solution with a lower viscosity. It will be understood, however, that for any given coating process, the viscosity of the POS solution used is not the only method for controlling the thickness of the resulting film. Thus spin speed, the amount of polymer dispensed and the like can also effect the final film thickness.

Once completing the application of the POS polymer film, in some embodiments of the present invention it has been found advantageous to selectively remove portions of the as-coated film. Thus in some embodiments, a pattern is applied to the POS polymer film by selective application of, for example, UV radiation or an electron beam. Where such patterning is desired, generally UV radiation is used. In embodiments employing such patterning, it has been found that inclusion of photo-sensitive ligands in the POS polymer enhances the formation of such patterned POS polymer films. Thus, the portions of the POS film exposed to UV energy become insoluble in organic solvents, such as those previously described, due to cross-linking, while the unexposed portions essentially retain their initial solubility. In this manner the unexposed portions are conveniently removed by immersing the substrate in an organic solvent and a patterned polyorganosilane polymer film is achieved.

In some embodiments of the present invention, the POS polymer film is cured in its entirety prior to any patterning. It has been found that such POS polymer film curing is accomplished using thermal energy, an electron beam, a plasma, UV radiation or some combination of two or more of the aforementioned energy sources applied to the POS polymer film. In some embodiments of the present invention, the substrate bearing the polyorganosilane polymer film is positioned in a vacuum oven having a pressure of approximately 10 Torr or less and an inert or reducing residual atmosphere. While maintaining the vacuum, the substrate is heated to a temperature of up to about 350° C. for a period of up to about 200 minutes. As it has been found that little or no cross-linking of the POS polymer occurs at or below 250° C., in embodiments where the POS polymer film has been applied to a surface of a substrate having topography, this initial heating step advantageously reduces the viscosity of the POS polymer film to enhance the planarization of that surface. In a second curing step, the substrate bearing the POS polymer film is raised to atmospheric pressure and heated in an inert or reducing atmosphere at a temperature above 350° C. and up to approximately 450° C. for a period of up to 200 minutes, wherein the specific time and temperature employed are used to control the amount of cross-linking within the polymer. In this manner, it has been found that a dielectric film having a dielectric constant of less than approximately 3.3 is formed.

In some embodiments, rather than a second curing step performed in an inert or reducing atmosphere, it has been found advantageous to employ an oxidizing atmosphere. Thus utilizing conditions similar to the second curing step described above, the inert or reducing atmosphere is replaced by an oxidizing atmosphere, for example air. In this manner, a POS polymer film cured at a temperature above 350° C. and up to approximately 450° C. for a period of up to 200 minutes results in a dielectric film having a dielectric constant of less than approximately 3.3. As previously described, the specific time and temperature employed are used to control the amount of cross-linking within the polymer.

In some embodiments of the present invention, a three step curing process is employed. This three step cure process combines the vacuum curing step as described above with a first inert or reducing atmosphere cure at up to approximately 450° C. and a second oxidizing atmosphere cure at up to approximately 450° C. In this manner, a dielectric film having a dielectric constant of less than approximately 3.3 is obtained.

It will be understood that in the previously described curing steps, an inert gas is exemplified by nitrogen, argon, helium or neon gas, where nitrogen is generally preferred. In addition, it will understood that a reducing gas is exemplified by hydrogen, ammonia or forming gas, where hydrogen is generally preferred. Finally, will be understood that while an oxidizing atmosphere is exemplified by air, various concentrations of oxygen or other materials that produce an oxidizing atmospheres can be employed. Thus, some embodiments of the present invention employ ozone, hydrogen peroxide or steam.

For each of the curing process described above, a dielectric films comprising silicon, oxygen and carbon having a dielectric constant lower than 3.3 is formed from the specific polyorganosilanes film applied to the substrate. As one having ordinary skill in the art will realize, the specific characteristics of the dielectric film so formed will vary as a result of, among other things, the specific curing process employed. Infrared spectrometric analysis of typical dielectric films formed in accordance with embodiments of the present invention show the presence of Si—O, Si—C, Si—O—Si, C—H and Si—C—H bonds proving a silicon oxide/carbide/oxycarbide film composition. Transmission Electron Microscopy (TEM) of these films shows an amorphous structure; and Auger Analysis (AA) indicates a typical film composition of between approximately 20 to 40 atomic percent (ate) silicon, approximately 10 to 60 at % oxygen and between approximately 10 to 40 at % carbon.

As previously mentioned, the thickness of the resulting dielectric films range from about 0.3 $\mu$m to about 1.5 $\mu$m depending upon the specific application for which the dielectric film is employed. Thus for damascene applications a thickness of about 0.3 $\mu$m to 0.7 $\mu$m is useful; for double damascene a thickness of about 0.7 $\mu$m to 1.25 $\mu$m is useful; and for interlayer dielectrics a thickness of about 1.2 $\mu$m to 1.5 $\mu$m is useful. It will be understood, however, that while specific ranges of thickness are described for the final dielectric film, other appropriate thickness are also useful.

It is found that the standard deviation of film thickness is generally less than 2%, and often less than 1%, of the average film thickness. In addition, the dielectric films of the present invention exhibit excellent gap-filling capability, filling gaps or spaces between adjacent conductive paths of 0.25 $\mu$m or less. The dielectric films of the present invention also exhibit superior planarization of typical semiconductor surfaces, as previously mentioned, where planarization of 85% or more is advantageously achieved. Examples of films prepared using the curing cycles discussed above are provided below.

In some embodiments of the present invention, a layer of silicon oxide is employed in conjunction with dielectric films formed as described above. Where such silicon oxide films are used, the silicon oxide film is generally formed overlying the polymer film using a chemical vapor deposition process. Such silicon oxide films typically are about 10 nanometers (nm) to 200 nm thick and preferably about 50 to 100 nm thick.

Vias or contact holes are typically etched through the dielectric layer of the present invention to allow for electrical contact between conductive paths. Such vias are formed by applying and patterning a layer of photoresist over the dielectric film to define the location and shape of the vias. Where an overlying silicon oxide layer is employed, the photoresist layer is formed and patterned over the silicon oxide film. The dielectric film, and silicon oxide film where employed, is etched using any of the appropriate anisotropic etch methods for a silicon oxide material. For example a reactive ion etch process employing a fluorinated hydrocarbon gas (e.g. trifluoromethane) and oxygen has been found appropriate, although other appropriate methods for forming vias can also be employed.

EXAMPLES

Embodiments of the present invention will be further described and understood by reference to the following working examples thereof. The following synthetic processes and film characteristics are non-limiting and only serve to illustrate the methods of making polyorganosilane polymers, solutions of those polymers and the properties of resultant films formed from those polymers. Table 1 demonstrates POS polymers in addition to those of Examples 1–3. Table 2 demonstrates that films comprising silicon, oxygen and carbon formed from polyorganosilanes in accordance with the present invention possesses superior properties.

Example 1

Substitution of Styrene

POS(50 g) in the form of formula 2 (commercially available from Nippon Carbon Co., Ltd. under the name of Polycarbosilane NIPUSI® Type A or Type S) is dissolved in 250 mL of xylenes (electronic purity purchased from Gallade Chemical). Styrene (12.5 g) (Aldrich) and 1-hexene (10 g) (Aldrich) are added into the POS Solution, followed by the addition of 4 drops of platinum-divinyl-tetramethyl-disiloxane complex (from Gelest, Inc.) The solution mixture is allowed to stir at room temperature. As the reaction proceeds, the intensity of the Si—H peak in the starting polymer is reduced as the Si—H bond is replaced in the product. After 12 hours, the reaction is complete.

Example 2

Substitution of Vinyl Bromide

POS (50 g) in the form of formula 2 is dissolved in 250 mL distilled hexanes. Vinyl bromide (98%, Aldrich) (22.5 g) added into the POS solution. Then 4 drops of platinum divinyltetramethyldisiloxane complex in xylene is added to the solution mixture. This solution mixture is allowed to stir at room temperature. As the reaction proceeds, the intensity of the Si—H in the starting polymer is reduced as the Si—H bond is replaced in the product by the bromo-ethyl group. After 5 hours the reaction is complete. The solvent, hexanes, is removed by vacuum evacuation at room temperature. A milky white solid, polymer (70 g) is produced.

Example 3

Substitution of Trimethylchlorosilane

POS (10 g) in the form of formula 2 is dissolved in an excess of trimethylchlorosilane (20 g) (Aldrich). Upon dissolution anhydrous aluminum chloride (Alfa) (0.5 g) is added. Following a 2 hour reflux, the excess trimethylchlorosilane is removed by vacuum distillation. The aluminum chloride is then removed by sublimation in vacuo. The unreacted POS is removed by extraction in hexane. After filtration, a white chlorinated polycarbosilane is obtained.

TABLE 1

Additional Modified POS Polymers

| Modified POS | Reactants POS(100 g) + | Reaction Conditions |
| --- | --- | --- |
| POS-phenyl-hexanyl | styrene (25 g) + 1-hexene (20 g) | Xylenes, r.t., 24 hrs |
| POS-bromopropyl | vinyl bromide (45 g) | Hexanes, r.t., 24 hrs |
| POS-phenyl | styrene (40 g) | Xylenes, r.t., 24 hrs |
| POS-cyclohexyl | vinylcyclohexane (35 g) | Xylenes, r.t., 24 hrs |
| POS-(1-pentenyl) | 1. POS-bromopropyl (50 g) + 7 g Mg powder 2.20 g $CH_2$=CH—$CH_2$Br | 1. $Et_2O$, r.t., 3 hrs 2. Cool to 0° C., 4 hrs |
| POS-chloride | $CH_3SiCl$ (200 ml) | Reflux, 2 hrs/$AlCl_3$ |

Example 4

Application of a POS Film by Spin-Coating

A six inch silicon wafer is cleaned by using 10% HF in methanol to remove organic and surface oxide first, then rinsed with isopropanol and DI water, and finally dried with blowing nitrogen.

A POS polymer (2 g) is dissolved in 10 mL xylenes. The coating solution is dropped onto the motionless substrate first by using a syringe filter to ensure a premium film quality, then the wafer is started and maintained for 20 seconds at 3500 rpm. This uncured coating has a color range from red to purple. FT IR of the film can be recorded by the coating on double wide polished silicon wafer.

Example 5

Curing a POS Polymer Film on a Substrate

The curing process is performed inside a quartz tube and a tube-type oven equipped with auto temperature control is used for heating.

The coated wafer is first evacuated and refilled with $N_z$ at room temperature for three times to get rid of the trace amount of oxygen then under a vacuum of 50 millitorr, the temperature is raised slowly to 250° C. in a period of 20 min. The temperature is introduced to the quartz tubing. The temperature is raised to 425° C. in a period of 20 min., then allowed to hold at 425° C. for 30 min under $N_2$. Then the quartz tube is opened to the air and the coating is allowed to cure in the air at 425° C. for 30 min. After that, the temperature is allowed to cool to room temperature over a period of 2 hours.

Table 2 below represents a summary of experimental results. Each of the POS polymers was spin-coated onto a silicon semiconductor substrate and cured, as indicated, by the vacuum+inert, vacuum+oxidizing or the vacuum+inert+ oxidizing cure cycles previously discussed and a vacuum only cycle. For each sample, the dielectric constant (K) was measured using the well known metal/insulator/metal (MIM) structure. Specifically, each POS polymer was coated overlying a first array of 64 gold dots. After cure, a second array of 64 gold dots was aligned with the first array. Using the first and second arrays as electrodes, the capacitance of each film was measured at a frequency of 1 Megahertz. The thickness of each film was measured by cleaving each sample and using a scanning electron microscope to form an image of the film in cross-section. The dielectric constant is then:

$$K = \epsilon Ct/A$$

where $\epsilon$ is permittivity ($8.85 \times 10^{-14}$ F/cm), C is the measured capacitance, t is the film thickness and A the area of the electrodes.

Thermal stability was measured by Thermal Gravimetric Analysis (TGA). Film adhesion to the silicon substrate was evaluated by forming POS polymer films overlying patterned aluminum stripes of various pitches formed on a silicon substrate. After cure, a standard ASTM "Tape Test" was performed. All samples were evaluated microscopically for evidence of separation of the POS film at the film aluminum interface. No such separation was observed.

TABLE 2

Film Properties by Cure Process

| Cure Condition | Film Thickness Ellipsometer | Refractive Index | Dielectric Constant @ 1 Mhz | Thermal Stability Δ wt % 1 hr @ 500° C. | Adhesion ASTM Tape Test (W/Al) |
|---|---|---|---|---|---|
| Vacuum only @ 450° C. | 673.6 nm | 1.48 | 2.09 | 1.2 | pass both |
| Vacuum + $N_2$ @ 450° C. | 665.0 nm | 1.45 | 2.31 | 1.1 | pass both |
| Vacuum + $O_2$ @ 450° C. | 632.9 nm | 1.80 | 3.28 | 0.1 | pass both |
| Vacuum + $N_2$ + $O_2$ @ 450° C. | 653.2 nm | 1.44 | 1.88 | 0.1 | pass both |

By now it should be realized that embodiments of the present invention have been described that provide a final film comprising silicon, oxygen and carbon wherein the advantages of a film formed from organic materials, e.g. a low dielectric constant, are combined with those of a film formed from inorganic materials, e.g. thermal stability. It should also be realized that films in accordance with embodiments of the present invention are formed from a polyorganosilane material that is applied to a substrate in a manner essentially similar to that of an organic polymer. In addition, it should also be realized that the final dielectric film formed, has superior adhesion to metals such as tungsten (W) and aluminum (Al) and is thermally stable to temperatures in excess of 450° C.

We claim:

1. A method of forming a dielectric film comprising silicon, oxygen and carbon overlying a semiconductor substrate comprising:
   providing a solution of a polyorganosilane polymer;
   applying a coating of said solution on said semiconductor substrate;
   heating said semiconductor substrate to a temperature of up to approximately 450 degrees Centigrade for a period of not longer than 200 minutes in a first atmosphere, wherein said first atmosphere is at a reduced pressure;
   bringing said coated semiconductor substrate to atmospheric pressure in a second atmosphere; and
   heating said substrate to a temperature of up to approximately 450 degrees Centigrade for a period of not longer than 200 minutes.

2. The method of claim 1 wherein providing a solution of a polyorganosilane polymer comprises providing a polyorganosilane polymer having the general structure:

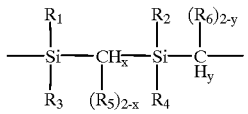

wherein R1, R2, R3, R4 are each independently selected from a group consisting of hydrogen, halide, alkyl, alkenyl, cycloalkyl and aryl, and wherein x and y are each independently 1 or 2 and R5 and R6 are each an organosilane group.

3. The method of claim 2 wherein heating said semiconductor substrate in a first atmosphere comprises heating in an inert or reducing atmosphere having a pressure of approximately 10 Torr or less.

4. The method of claim 3 wherein heating said semiconductor substrate in a first atmosphere comprises:
   placing said semiconductor substrate in an enclosure;
   purging said enclosure with nitrogen wherein residual oxygen is removed;
   evacuating said enclosure wherein a nitrogen pressure of approximately 50 milliTorr is obtained; and
   increasing the temperature within the enclosure to a temperature of up to approximately 450 degrees Centigrade.

5. The method of claim 1 further comprising replacing said second atmosphere with air and heating said substrate to a temperature of up to approximately 450 degrees Centigrade for a period of not longer than 200 minutes.

6. The method of claim 1 wherein said first atmosphere is essentially free of oxygen.

7. A dielectric film having a dielectric constant of less than 3.0 comprising a polyorganosilane polymer, wherein said polyorganosilane polymer has between 2 to 10,000 repeating units of the general structure:

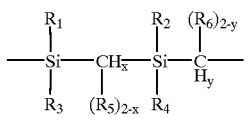

wherein R1, R2, R3, R4 are each independently selected from a group consisting of hydrogen, halide, alkyl, alkenyl, cycloalkyl and aryl; and wherein x and y are each independently 1 or 2 and R5 and R6 are each an organosilane group.

8. The dielectric film of claim 7 comprising between approximately 20 to 40 atomic percent (at %) silicon, between approximately 10 to 60 at % oxygen and between approximately 20 to 40 at % carbon.

9. The dielectric film of claim 7 produced by a process comprising:
   providing a solution of said polyorganosilane polymer;
   applying said solution to a substrate wherein a polymer film is formed; and
   curing said polymer film wherein said substrate and said polymer film are heated:
   a) to a first temperature for a first period of time in a first atmosphere, said first atmosphere being a reduced pressure atmosphere;
   b) to a second temperature for a second period of time in a second atmosphere; and c) to a third temperature for a third period of time in a third atmosphere.

10. The dielectric film of claim 9 wherein curing said polymer film comprises heating to said first temperature of at least approximately 250 degrees Centigrade in said first atmosphere, having a reduced pressure of approximately 50 milliTorr and comprising nitrogen.

11. The dielectric film of claim 10 comprising between approximately 20 to 40 atomic percent (at %) silicon, between approximately 10 to 60 at % oxygen and between approximately 20 to 40 at % carbon.

12. The dielectric film of claim 9 wherein curing said polymer film comprises heating to a second temperature of at least approximately 425 degrees Centigrade in a second atmosphere comprising nitrogen at atmospheric pressure.

13. The dielectric film of claim 9 wherein curing said polymer film comprises heating to a third temperature of at least approximately 425 degrees Centigrade in a third atmosphere comprising air at atmospheric pressure.

14. A process for forming a polycarbosilane based dielectric film having a dielectric constant of less than 3.0 comprising:

providing a solution of a silicon based polymer material;

coating a substrate with said solution to form a layer of polymer material; and curing said layer wherein said substrate is first heated to approximately 250 degrees Centigrade at a pressure lower than about 10 torr for a first time period, and to a temperature sufficiently high to induce cross-linking of said silicon-based polymer material for a second time period, wherein said dielectric film is formed.

15. The semiconductor integrated circuit of claim 14 wherein said polycarbosilane based dielectric film is an amorphous silicon oxide/silicon carbide/silicon oxycarbide composition comprising between approximately 20 to 40 atomic percent (at %) silicon, between approximately 10 to 60 at % oxygen and between approximately 20 to 40 at % carbon.

16. The process of claim 14, wherein curing said layer at a pressure lower than about 10 torr comprises curing in an essentially oxygen free atmosphere.

17. A semiconductor integrated circuit comprising a polycarbosilane based interlayer dielectric film formed employing a first, reduced pressure heating step and a second, atmospheric pressure heating step.

18. The semiconductor integrated circuit of claim 17, wherein the first heating step comprises a reduced pressure atmosphere essentially free of oxygen.

* * * * *